(12) United States Patent
Val

(10) Patent No.: US 9,111,688 B2
(45) Date of Patent: Aug. 18, 2015

(54) METHOD FOR PRODUCING RECONSTITUTED WAFERS WITH SUPPORT OF THE CHIPS DURING THEIR ENCAPSULATION

(75) Inventor: Christian Val, Ville (FR)

(73) Assignee: 3D PLUS, Buc (FR)

( * ) Notice: Subject to any disclaimer, the term of this patent is extended or adjusted under 35 U.S.C. 154(b) by 0 days.

(21) Appl. No.: 14/115,853

(22) PCT Filed: May 4, 2012

(86) PCT No.: PCT/EP2012/058195
 § 371 (c)(1),
 (2), (4) Date: Jul. 23, 2014

(87) PCT Pub. No.: WO2012/152672
 PCT Pub. Date: Nov. 15, 2012

(65) Prior Publication Data
 US 2014/0349008 A1    Nov. 27, 2014

(30) Foreign Application Priority Data

May 6, 2011 (FR) ...................................... 11 53902

(51) Int. Cl.
 *H01G 4/224* (2006.01)
 *H05K 3/28* (2006.01)
 (Continued)

(52) U.S. Cl.
 CPC .............. *H01G 4/224* (2013.01); *H01L 21/568* (2013.01); *H01L 24/18* (2013.01); *H01L 24/82* (2013.01); *H01L 24/96* (2013.01); *H01L 24/97* (2013.01); *H05K 3/284* (2013.01); *B05D 1/02* (2013.01); *B05D 5/10* (2013.01); *C23C 14/08* (2013.01); *C23C 16/01* (2013.01); *C23C 16/402* (2013.01); *H01L 23/3121* (2013.01); *H01L 2221/68368* (2013.01); *H01L 2224/24227* (2013.01); *H01L 2224/73267* (2013.01); *H01L 2224/97* (2013.01); *H01L 2924/01005* (2013.01); *H01L 2924/01006* (2013.01); *H01L 2924/01013* (2013.01);
 (Continued)

(58) Field of Classification Search
 USPC ................................................. 427/96.2–96.8
 See application file for complete search history.

(56) References Cited

U.S. PATENT DOCUMENTS 8,178,953 B2 * 5/2012 Barth et al. .................... 257/659
8,258,012 B2 * 9/2012 Pagaila et al. ................. 438/113
(Continued)

FOREIGN PATENT DOCUMENTS

FR   2843485 A1   2/2001
JP   5940542 A    3/1984
WO  2010102996 A1 9/2010

*Primary Examiner* — Brian K Talbot
(74) *Attorney, Agent, or Firm* — Baker & Hostetler LLP

(57) ABSTRACT

A method for collectively fabricating a reconstituted wafer comprising chips exhibiting connection pads on a front face of the chip, comprises: positioning the chips on an initial adhesive support, front face on the support, vapor deposition at atmospheric pressure and ambient temperature, of an electrically insulating layer on the initial support and the chips, having a mechanical role of holding the chips, transfer of the chips covered with the mineral layer onto a provisional adhesive support, rear face of the chips toward this provisional adhesive support, removal of the initial adhesive support, overlaying the chips onto a support of "chuck" type, front faces of the chips toward this support, removal of the provisional adhesive support, deposition of a resin on the support of "chuck" type to encapsulate the chips, and then polymerization of the resin, removal of the support of "chuck" type, production of an RDL layer active face side.

4 Claims, 3 Drawing Sheets

(51) Int. Cl.
- H01L 21/56 (2006.01)
- H01L 23/00 (2006.01)
- C23C 14/08 (2006.01)
- C23C 16/01 (2006.01)
- C23C 16/40 (2006.01)
- B05D 5/10 (2006.01)
- B05D 1/02 (2006.01)
- H01L 23/31 (2006.01)
- H05K 1/11 (2006.01)
- H05K 1/18 (2006.01)

(52) U.S. Cl.
CPC .......... *H01L2924/01029* (2013.01); *H01L 2924/01058* (2013.01); *H01L 2924/01061* (2013.01); *H01L 2924/01079* (2013.01); *H01L 2924/1461* (2013.01); *H01L 2924/15153* (2013.01); *H05K 1/115* (2013.01); *H05K 1/181* (2013.01)

(56) References Cited

U.S. PATENT DOCUMENTS

| | | | |
|---|---|---|---|
| 8,389,333 B2 * | 3/2013 | Camacho | 438/112 |
| 8,390,107 B2 * | 3/2013 | Meyer | 257/684 |
| 8,546,190 B2 | 10/2013 | Val | |
| 8,648,470 B2 * | 2/2014 | Lin et al. | 257/774 |
| 2008/0265421 A1 | 10/2008 | Brunnbauer et al. | |
| 2010/0006988 A1 | 1/2010 | Tang et al. | |
| 2010/0047567 A1 * | 2/2010 | Souriau | 428/339 |
| 2011/0024894 A1 | 2/2011 | Perng et al. | |
| 2011/0278703 A1 | 11/2011 | Pagaila et al. | |
| 2012/0049388 A1 * | 3/2012 | Pagaila | 257/783 |

\* cited by examiner

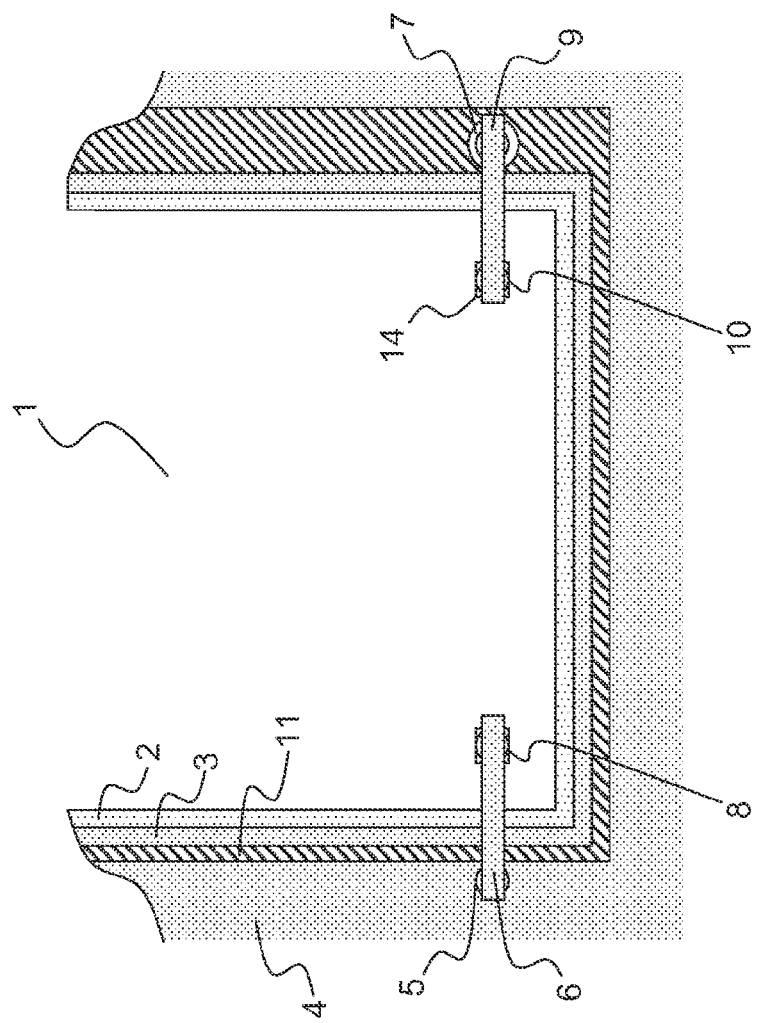

METHOD FOR PRODUCING RECONSTITUTED WAFERS WITH SUPPORT OF THE CHIPS DURING THEIR ENCAPSULATION

CROSS-REFERENCE TO RELATED APPLICATIONS

This application is a National Stage of International patent application PCT/EP2012/058195, filed on May 4, 2012, which claims priority to foreign French patent application No. FR 1153902, filed on May 6, 2011, the disclosures of which are incorporated by reference in their entirety.

FIELD OF THE INVENTION

The field of the invention is that of the fabrication of reconstituted wafers which comprise chips encapsulated in a resin, these chips having in general been tested beforehand.

BACKGROUND

The solution most commonly implemented to produce a reconstituted wafer consists firstly in slicing wafers on which chips have been fabricated to obtain individual chips, a wafer producing mutually identical chips of a first type, another wafer producing chips of another type, etc. The term chip refers to an active electronic component such as a bare chip or a passive component (capacitors, resistors, transformers or inductors, etc.) or a MEMS, the acronym standing for "Micro Electro Mechanical System". Generally, these chips are then selected after having been tested and often termed "Known Good Die".

The various types of chips 1 tested, which exhibit connection pads 14 on a face termed the active face or front face, are then picked up and positioned front face on an adhesive support 13 as shown in FIG. 2a, by means for example of a "pick-and-place" machine so as to form generally mutually similar patterns of chips. The term pattern of chips designates a group of various chips intended to form an electronic element.

This adhesive support 13 is typically a tacky skin, itself stuck to a rigid support. Next the chips are encapsulated in a polymer resin 12 of epoxy type so as to bind them.

A redistribution layer or RDL, the acronym standing for "ReDistribution Layer", optionally with several stages, is thereafter formed on the front face side, after removal of the adhesive support 13 and of the tacky skin; this RDL layer which comprises tracks made of TiW/Cu or TiPd/Au for example, is formed on a dielectric layer 11 deposited in place of the adhesive support, by dipping or by centrifugation, and which is represented in FIGS. 3, 4 and 5. The wafer thus reconstituted which does not comprise any defective chips can then be sliced to obtain plastic micro packages; it can also be stacked on other reconstituted wafers, and connected electrically to these wafers according to various known methods, the stack thereafter being sliced to obtain three-dimensional or 3D electronic modules.

The encapsulation of the chips comprises:
- a step of depositing the resin (by so-called compression casting or molding), around and optionally on the chips stuck on the adhesive support, so as to fill the inter-chip spaces,
- a step of polymerizing the resin so as to harden it and thus form a rigid and manipulatable substrate in which the chips are fixed, it then being possible for the adhesive substrate to be removed.

An evident drawback is the displacement of the chips during the deposition of the resin and/or during its polymerization, the pads of the chips then no longer coinciding with the tracks of the redistribution layer (RDL layer). The micro displacements of the chips with respect to the envisaged position, illustrated in FIG. 1, are due to:
- the inaccuracy of positioning of the chips on the adhesive support, which is of the order of 5 µm with recent "pick-and-place" equipment operating at high speed,
- the reversible but very high expansion of the adhesive support in the vicinity of 100 ppm/° C., illustrated by the arrows C,
- the irreversible shrinkage of the resin during the polymerization of the order of a few 1000 ppm/° C., illustrated by the arrows A,
- the reversible expansion of the resin after polymerization of about 16 to 17 ppm/° C., illustrated by the arrows B.

This results in more or less isotropic and unforeseeable micro displacements, typically of between a few µm and a few tens of µm, this possibly exceeding the positioning (with respect to the RDL layer) tolerances required after molding, which are typically of the order of 10 µm.

A solution consists in studying and recording these micro displacements beforehand and then in anticipating them during the positioning of the chips when they are overlaid onto the adhesive support. One of the limits of this technique stems from the fact that the micro displacements are not all foreseeable, notably those of the various types of chips within one and the same pattern.

Another existing solution consists in laying on the adhesive support a copper lattice with rectangular mesh cells of larger dimensions than the chip of about 1 to 1.5 mm, and then in overlaying the chips onto the support in the cavities situated between the criss-crossed bars of the lattice; this lattice is thus used as template in which the chips are placed and makes it possible to limit the volume of resin surrounding the chip and therefore to locally limit the shrinkage after polymerization. This method makes it possible to reduce the expansion and therefore the displacement of the chips but does not make it possible to eliminate it since this does not resolve the problem of the tacky skin which likewise moves. In all cases, the masks making it possible to produce the redistribution layers are corrected. After the production of the first 3 or 4 wafers, the measurements of drift of the chips are performed and the masks are corrected accordingly. Thereafter, it is necessary that the drifts always be identical and reproducible. It furthermore exhibits the following drawbacks:
- the lattice necessarily remains in the final package since once molded in the resin, it can no longer be removed,
- this limits the number of chips on the wafer on account of the significant space taken up by the lattice,
- this requires double slicing to eliminate the bars of the lattice,
- the correction of the masks and therefore of the position of the conducting tracks of the redistribution layers can impede the subsequent stacking of the reconstituted wafers which require a rigorously constant spacing by construction.

It is also known to correct at one and the same time the position of the chips when overlaying the latter onto the tacky skin by modifying the placement spacing on the "Pick and Place" machines, and the masks used for the RDL. For the most critical cases, chip-by-chip irradiation is carried out, this being very expensive and not making it possible to guarantee the spacing for the stacking steps.

The applicant has described a solution in patent application WO2010/102996. It is based on the use of a grid not around the chips but on the chips so as to fix the latter in a fixed and non-modifiable "position" before the steps of molding followed by polymerization. A provisional grid of copper for example is stuck at ambient temperature onto the whole of the rear faces of the chips. After polymerization at ambient temperature or under ultraviolet for the so-called UV adhesives, the casting and the polymerization can be performed without displacement of the chips. The copper grid is thereafter dissolved chemically or the whole of the rear face of the reconstituted wafer is abraded mechanically. The only drawbacks of this technique are due to the fact that additional steps of sticking and of destroying the provisional grid are necessary.

SUMMARY OF THE INVENTION

The aim of the invention is to alleviate this drawback of displacement of the chips during their encapsulation in resin, without resorting to these steps of sticking and of destroying the grid.

According to the invention, the holding of the chips after the "Pick and Place" placement step is obtained by vapor deposition at ambient temperature, of electrically insulating mineral materials. This deposition can remain throughout the entire method of fabrication of the reconstituted wafer, or else be partially dissolved chemically.

This so-called "Atmospheric plasma deposition" technique exhibits several advantages. It is a non-vacuum technique of chemical vapor deposition (at atmospheric pressure) and at low temperature (ambient). Moreover, the adhesion is excellent since the plasma used allows the surface to be "cleaned" before deposition.

More precisely, the subject of the invention is a method for collectively fabricating a reconstituted wafer which comprises chips exhibiting connection pads on a face of the chip termed the front face, comprises a step of:

A) positioning of the chips on an initial adhesive support, front face on the support, and is characterized in that it comprises in order the following steps:

B) vapor deposition at atmospheric pressure and at ambient temperature, of an electrically insulating layer on the initial support and the chips, C) transfer of the chips covered with the mineral layer onto a provisional adhesive support, rear face of the chips toward this provisional adhesive support, D) removal of the initial adhesive support, E) overlaying of the chips onto a support of "chuck" type, front faces of the chips toward this support, F) removal of the provisional adhesive support, G) deposition of a resin on the support of "chuck" type so as to encapsulate the chips, and then polymerization of the resin, H) removal of the support of "chuck" type, I) production of an RDL layer active face side.

The electrically insulating layer has a mechanical role of holding the chips.

Optionally, step B) of depositing the insulating layer on the adhesive support furthermore comprises a step of vapor deposition at atmospheric pressure and at ambient temperature, of a first electrically conducting layer in contact with the electrically insulating layer, and forming the first electrode of a capacitor, and the RDL step comprises the following steps beforehand:

deposition of an insulating layer in contact only with the active face of the chips and of a second electrically conducting layer away from the active faces of the chips opposite the first electrode, this second layer forming the second electrode of the capacitor, production of electrically conducting tracks so as to connect the first electrode to a first power supply pad of the chip and the second electrode to another power supply pad of the chip.

The "RDL" electrode can be segmented into several electrodes, each segment being connected to another electrical power supply pad of the chip by a via drilled in the insulator.

BRIEF DESCRIPTION OF THE DRAWINGS

Other characteristics and advantages of the invention will become apparent on reading the detailed description which follows, given by way of nonlimiting example and with reference to the appended drawings in which.

From one figure to the other, the same elements are labeled by the same references.

DETAILED DESCRIPTION

The holding of the chips after the "Pick and Place" placement step is obtained by a (or several) vapor deposition(s) at atmospheric pressure and at ambient temperature, of electrically insulating mineral materials, this deposition being able to remain throughout the entire method of fabrication or else be partially dissolved chemically as will be seen.

The main steps of the method are described in conjunction with FIG. 2.

Figure 1:
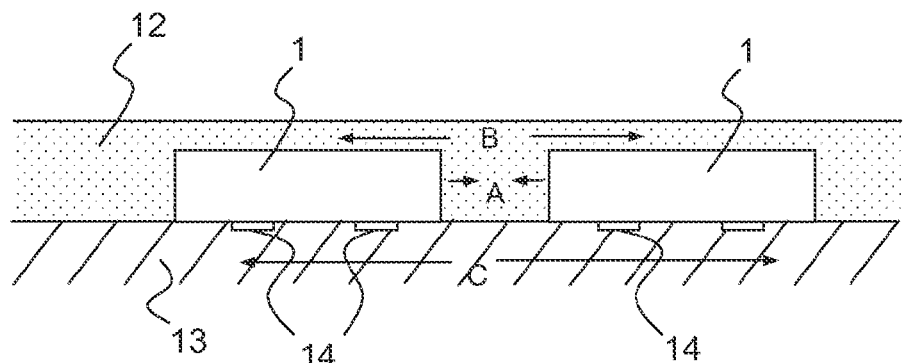
FIG. 1, already described, schematically illustrates the micro displacements to which the chips are subjected during their encapsulation, FIGS. 2a to 2c schematically represent the main steps according to the invention, including laying the chips on an adhesive support (FIG. 2a), and of depositing an electrically insulating layer on the wafer (FIG. 2b) and of encapsulating the chips (FIG. 2c), FIG. 3 schematically illustrate an exemplary mode of production of a capacitor on the basis of a successive deposition of two mineral layers, seen in section (FIG. 3a) and from the underside (FIG. 3b) according to the invention; the underside view is represented without the RDL insulating layer(s).
Figure 2A:
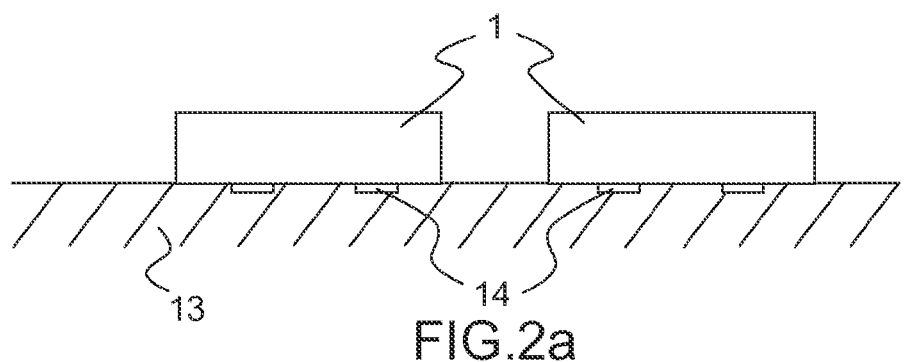

In a conventional manner, the chips 1 are overlaid and positioned on an adhesive support 13 comprising a "tacky skin", the front faces comprising the connection pads 14 (also termed active faces) being on this adhesive support (FIG. 2a).

Figure 2B:
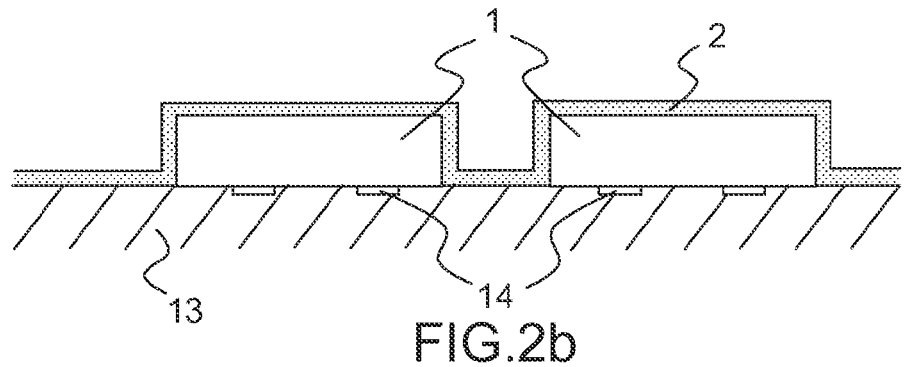

According to the invention, an electrically insulating layer 2 of a few microns (from 1 μm to 10 μm) is deposited on the whole of the reconstituted wafer, that is to say on the chips 1 and the support 13, at ambient temperature and at atmospheric pressure (FIG. 2b).

According to a first mode of production, a single electrically insulating layer 2 is deposited, such as for example a layer of $SiO_2$. This exhibits the following advantages:

this layer 2 remains and thus affords better mechanical continuity with the silicon chips;

the interconnection conducting tracks of the "RDL" redistribution layer generally made of copper, will have better electrical properties than in the case of deposition on polymer materials (used for the dielectrics) since the electrical permittivity of silica is around 3.8 compared with that of the polymers making it possible to produce the RDL levels which is about 4.5 to 5;

moreover, in the case of stacked chips that have to be decoupled thermally, a layer of a few microns of a likewise thermally insulating material like silica can make it possible to decrease the thermal exchange between two superposed chips.

Figure 2C:
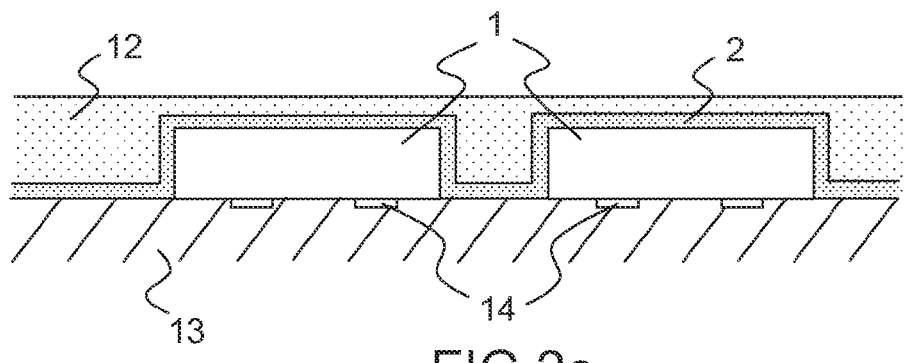

The chips 1 being thus held in position by virtue of this layer 2, the step of molding followed by polymerization of the resin 12 can occur (FIG. 2c). The standard method consisting in compression casting or molding the resin, is used. The adhesive support 13 is then detached.

It is known that the polymerization temperature of the resins 12 determines their thermo mechanical behavior in general. Thus, the higher the temperature at which a resin of epoxy type is polymerized (for example 220° C. instead of 140° C.) the higher its glass transition temperature (Tg) will be. Now, a mineral layer can support these higher temperatures, this not being the case for an organic layer such as that of the adhesive supports. This adhesive support will therefore be replaced with a conventional non-adhesive support ("carrier") supporting these high temperatures; a steel wafer support (or "wafer chuck") drilled with holes is typically used. One proceeds in the following manner. Transfer of the rear faces of the chips onto a provisional adhesive support makes it possible to eliminate the initial adhesive support of the active faces and thus to re-establish the vacuum around the reconstituted wafer on the support of "chuck" type (active face toward the "chuck"). After the removal of the provisional adhesive support, it is then possible to cast the resin and then polymerize it at a high temperature. The support of "chuck" type is then removed.

The method continues with the production of the so-called RDL layer.

According to another mode of production, two successive depositions of a mineral layer are combined, thereby making it possible notably to strengthen the holding of the chips in position. The laying down in order of an electrically insulating layer 2 and of a copper conducting layer 3 for example makes it possible furthermore, by depositing the two, to construct a capacitor. It is indeed known that one of the main problems with fast circuits (microprocessors, memories etc.) is the distributing of energy as close as possible to the demand (in this instance, the chip) so as to minimize the inductances of the conducting tracks which lead to delays in the power supply for these circuits.

Figure 3A:
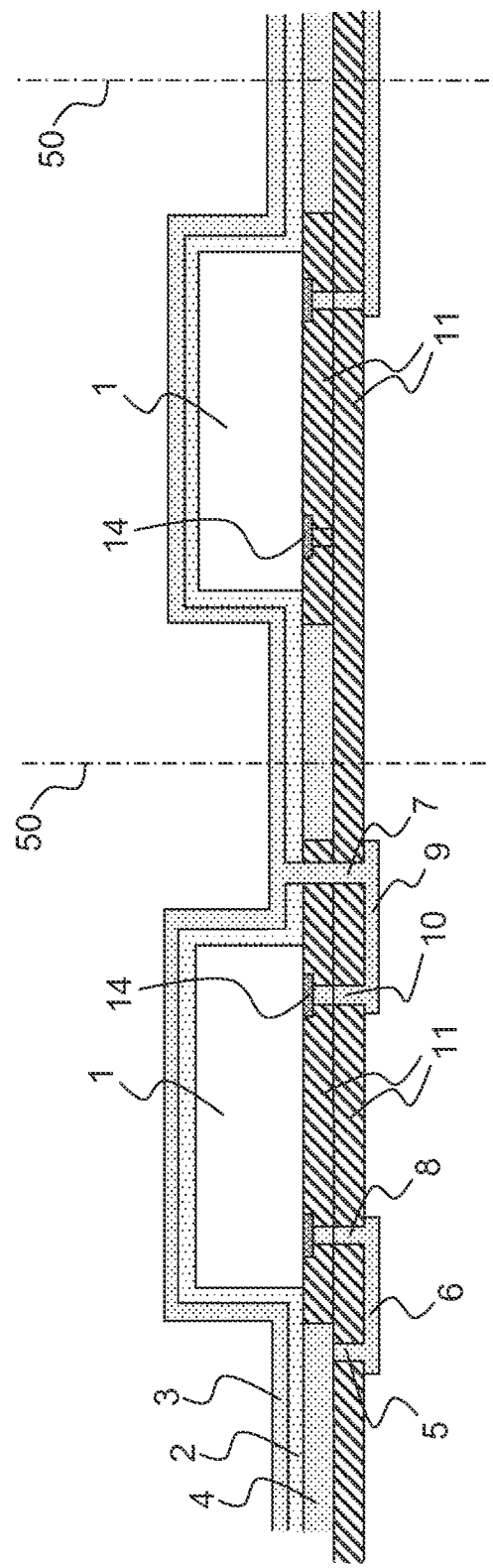

The successive deposition of an electrically insulating layer and of an electrically conducting layer makes it possible to use the whole of the surface around each chip (or a part of the latter: the capacitor surrounds the chip preferably on its 4 sides; but it may surround it on just one 2 or 3 sides) and serving as support for the so-called RDL interconnection, to form one or more capacitors as shown in FIG. 3. Preferably, the capacitor surrounds the chip on its 4 sides; but it may surround it on just one 2 or 3 sides.

According to this mode of production, after the step of atmospheric plasma deposition of an electrically insulating layer 2 rear face side, a second atmospheric plasma deposition of an electrically conducting layer 3 on this layer 2 (rear face side), will make it possible to constitute the first electrode 3 of the capacitor. After the step of molding and polymerizing the resin, and prior to the production of the RDL initially envisaged, an electrically conducting layer 4 is deposited active face side of the wafer but away from the active faces of the chips, so as to produce the second electrode 4 opposite the first, an electrically insulating layer 11 termed the RDL insulator being deposited in contact with the active faces of the chips as may be seen in the figure. A heterogeneous layer formed of an electrically conducting part 4 and of an electrically insulating part 11 is thus obtained.

Holes or "vias" are produced in the RDL insulator 11, so as to connect the two electrodes 3 and 4 of the capacitor in as short a way as possible to the electrical power supplies of the chip on the one hand (in this instance, this involves electrical power supply pads 14 of the chips) and to the external electrical power supplies of the capacitor on the other hand.

The second electrode 4 is connected to a first electrically conducting track 6, this track formed on the RDL insulator being joined by a first via 8 to a pad 14 of the chip corresponding to the electrical power supply of the latter. As may be seen in FIG. 3b, this second electrode is extended in the form of a track as far as a slicing line 50 in anticipation of the lateral interconnection (according to the dimension of the stack) of a 3D module; or a track is formed on the RDL insulator as far as the slicing line. When another electrically insulating layer has been deposited on the heterogeneous layer comprising the second electrode 4 and the RDL insulator 11, this second electrode 4 is connected to the first conducting track 6 by a second via 5 passing through this other layer, as shown in FIG. 4, the first via 8 also passing through this other layer.

A third via 7 makes it possible to connect the first electrode 3 formed by the electrically conducting layer 3 with a second electrically conducting track 9 linking a fourth via 10, this track being joined to a second electrical power supply pad 14 of the chip 1. This first electrode is extended in the form of a track as far as another slicing line 50 in anticipation of the lateral interconnection (according to the dimension of the stack) of the 3D module; or a track is formed on the RDL insulator as far as the slicing line.

An electrically insulating layer 11 termed an RDL insulator is deposited on the whole of the surface of the wafer active face side, and then the interconnections of the two electrodes 3 and 4 with the power supply pads 14 of the chip on the one hand and with the external power supplies on the other hand are produced. The first electrode 3 is linked by a via 15 to a conducting track 16 itself linked to a power supply pad 14 by a via 22. This electrode 3 is extended in the form of a track 23 as far as the future slicing path 50 in anticipation of the lateral interconnection (according to the dimension of the stack) of the 3D module; or a track is formed on the RDL insulator as far as the slicing line. Likewise, the second electrode 4 is linked by another via 20 to another conducting track 21 itself linked to another power supply pad 14 by a via 19. This electrode 4 is also extended in the form of a track 24 as far as another future slicing path 50 in anticipation of the lateral interconnection (according to the dimension of the stack) of the 3D module; or a track is formed on the RDL insulator as far as the slicing line. The vias pass through the RDL insulator 11, optionally deposited as several layers 11, 17.

An RDL insulating layer 18 can be deposited active face side so as to cover the tracks 21 and 16.

For the case where several electrical voltages are required, an electrode of the capacitor can be segmented into 2, 3 or "n" parts so as to constitute as many capacitors which are connected to other electrical power supply pads of the chip which are envisaged for this purpose, by virtue of other vias.

The electrodes 3, 4 of the capacitor being thus connected to the electrical power supplies of the chip and to the future external power supplies, the production of the RDL initially envisaged can then be carried out, its first or only stage being produced at the level of the conducting tracks 6 and 9, or 16 and 21.

The invention claimed is:

1. A method for collectively fabricating a reconstituted wafer which comprises chips exhibiting connection pads on a front face of the chips, comprising:

positioning the chips on an initial adhesive support, the front face of the chips being on the support, a step of vapor deposition at atmospheric pressure and at ambient temperature, of an electrically insulating mineral layer on the initial support and the chips, said layer having a mechanical role of holding the chips, transferring the chips covered with the electrically insulating mineral layer onto a provisional adhesive support, a rear face of the chips being toward the provisional adhesive support, removing the initial adhesive support, overlaying the chips onto a support of chuck, front faces of the chips toward this support, removing the provisional adhesive support, deposition of a resin on the support of chuck so as to encapsulate the chips, and then polymerization of the resin, removing the support of chuck, producing an RDL layer active face side.

2. The method for collectively fabricating a reconstituted wafer as claimed in claim 1, wherein the electrically insulating mineral layer is a layer of SiO2.

3. The method for collectively fabricating a reconstituted wafer as claimed in claim 1, wherein the step of vapor deposition further comprises:

vapor deposition at atmospheric pressure and at ambient temperature, of a first electrically conducting mineral layer in contact with the electrically insulating mineral layer, and forming the first electrode of a capacitor, and the producing of an RDL layer comprises the following steps beforehand:

deposition of an insulating layer in contact only with the active face of the chips and of a second electrically conducting layer away from the active faces of the chips opposite the first electrode, this second layer forming the second electrode of the capacitor, production of electrically conducting tracks so as to connect the first electrode to a first power supply pad of the chip and the second electrode to another power supply pad of the chip.

4. The method for collectively fabricating a reconstituted wafer as claimed in claim 1, wherein an electrode is segmented into several electrodes, each segment being connected to another electrical power supply pad of the chip.

* * * * *